United States Patent
Wu et al.

(10) Patent No.: US 10,236,468 B2
(45) Date of Patent: Mar. 19, 2019

(54) HYBRID LIGHT EMITTING DEVICE, DISPLAY PANEL AND DISPLAY DEVICE

(71) Applicant: BOE TECHNOLOGY GROUP CO., LTD., Beijing (CN)

(72) Inventors: Changyen Wu, Beijing (CN); Yingying Song, Beijing (CN); Chunjing Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,688

(22) PCT Filed: May 10, 2017

(86) PCT No.: PCT/CN2017/083726
§ 371 (c)(1),
(2) Date: Dec. 14, 2017

(87) PCT Pub. No.: WO2017/206681
PCT Pub. Date: Dec. 7, 2017

(65) Prior Publication Data
US 2018/0190930 A1 Jul. 5, 2018

(30) Foreign Application Priority Data
May 31, 2016 (CN) .......................... 2016 1 0379291

(51) Int. Cl.
*H01L 51/52* (2006.01)
*H01L 51/50* (2006.01)
*H01L 27/32* (2006.01)

(52) U.S. Cl.
CPC ...... *H01L 51/5084* (2013.01); *H01L 27/3211* (2013.01); *H01L 51/504* (2013.01); *H01L 51/5206* (2013.01); *H01L 2251/50* (2013.01)

(58) Field of Classification Search
CPC ............. H01L 51/5084; H01L 27/3211; H01L 51/5206; H01L 51/504
See application file for complete search history.

(56) References Cited

U.S. PATENT DOCUMENTS

2010/0181556 A1  7/2010  Wang
2015/0001499 A1  1/2015  Kim et al.
(Continued)

FOREIGN PATENT DOCUMENTS

CN   103682116 A   3/2014
CN   104576950 A   4/2015
(Continued)

OTHER PUBLICATIONS

Office Action received for Chinese Patent Application No. 201610379291.9, dated Mar. 8, 2018, 15 pages (9 pages of English Translation and 6 pages of Office Action).
(Continued)

*Primary Examiner* — Nicholas J Tobergte
(74) *Attorney, Agent, or Firm* — Womble Bond Dickinson (US) LLP

(57) ABSTRACT

A hybrid light emitting device, a display panel, and a display device are disclosed. The hybrid light emitting device comprises a first electrode, a light emitting material composite layer, a hybrid connecting composite layer, a first light emitting layer, and a second electrode which are stacked in this order. The first electrode and second electrode are configured to provide a first carrier and a second carrier during operation, respectively. The hybrid connecting composite layer comprises at least two hybrid connecting layers. In a direction from the first electrode to the second electrode, the at least two hybrid connecting layers increase in term of the first carrier mobility and decrease in term of the second carrier mobility.

20 Claims, 2 Drawing Sheets

(56) References Cited

U.S. PATENT DOCUMENTS

| | | | |
|---|---|---|---|
| 2015/0108456 A1 | 4/2015 | Shin et al. | |
| 2015/0162559 A1* | 6/2015 | Wu | H01L 51/56 |
| | | | 257/40 |
| 2017/0040561 A1 | 2/2017 | Wu et al. | |
| 2017/0213875 A1 | 7/2017 | Bi | |

FOREIGN PATENT DOCUMENTS

| | | |
|---|---|---|
| CN | 105161628 A | 12/2015 |
| CN | 105185917 A | 12/2015 |
| CN | 106058062 A | 10/2016 |

OTHER PUBLICATIONS

Office Action received for Chinese Patent Application No. 201610379291.9, dated Jun. 7, 2017, 17 pages (9 pages of English Translation and 8 pages of Office Action).

International Search Report received for PCT Patent Application No. PCT/CN2017/083726, dated Aug. 2, 2017, 6 pages (2 pages of English Translation and 4 pages of Original Document).

\* cited by examiner

HYBRID LIGHT EMITTING DEVICE, DISPLAY PANEL AND DISPLAY DEVICE

RELATED APPLICATIONS

The present application is the U.S. national phase entry of PCT/CN2017/083726, with an international filing date of May 10, 2017, which claims the benefit of Chinese Patent Application No. 201610379291.9, filed on May 31, 2016, the entire disclosures of which are incorporated herein by reference.

TECHNICAL FIELD

The present disclosure relates to the field of display technology, and particularly to a hybrid light emitting device, display panel and display device.

BACKGROUND

With the development of display technique, a hybrid light emitting device is expected to be extensively applied to a flat display due to advantages like self-luminous feature, all solid state property, and quick response. The hybrid light emitting device is generally formed by two processes, i.e., a solution process and an evaporation process. These processes are used to form a light emitting layer (EML) in different layers. Upon contact with each other, the light emitting layers formed by these two processes is subject to degradation in the interfacial property. This reduces performance the hybrid light emitting device, such as luminous efficiency, lifetime, or the like. There is a need in the art to improve performance the hybrid light emitting device, such as luminous efficiency, lifetime, or the like.

SUMMARY

Embodiments of the present disclosure provide a hybrid light emitting device, a display panel, and a display device, which improve display effect of the display device.

In a first aspect, embodiments of the present disclosure provide a hybrid light emitting device, comprising a first electrode, a light emitting material composite layer, a hybrid connecting composite layer, a first light emitting layer, and a second electrode which are stacked in this order, wherein a projection of the first light emitting layer on the first electrode at least partially does not overlap with a projection of the light emitting material composite layer on the first electrode; wherein the first electrode and the second electrode are configured to provide a first carrier and a second carrier during operation, respectively; and wherein the hybrid connecting composite layer comprises at least two hybrid connecting layers, and in a direction from the first electrode to the second electrode, the at least two hybrid connecting layers increase in term of the first carrier mobility and decrease in term of the second carrier mobility.

For example, the hybrid connecting composite layer has a total thickness of about 1 nm~10 nm.

For example, the hybrid connecting composite layer comprises two hybrid connecting layers, and each of the hybrid connecting layers has a thickness smaller than 3 nm.

For example, the hybrid connecting composite layer comprises at least two hybrid connecting layers.

For example, each of the at least two hybrid connecting layers has a triplet energy level larger than 2.1 eV.

For example, the hybrid light emitting device further comprises a first carrier transport layer which is arranged between the first electrode and the light emitting material composite layer.

For example, the hybrid light emitting device further comprises a first carrier inject layer which is arranged between the first electrode and the first carrier transport layer.

For example, the hybrid light emitting device further comprises a second carrier transport layer which is arranged between the first light emitting layer and the second electrode.

For example, the hybrid light emitting device further comprises a second carrier inject layer which is arranged between the second carrier transport layer and the second electrode.

For example, the light emitting material composite layer comprises a second light emitting layer and a third light emitting layer which are arranged in a same layer.

For example, the first light emitting layer is a light emitting layer for emitting blue light, the second light emitting layer is a light emitting layer for emitting green light, and the third light emitting layer is a light emitting layer for emitting red light.

For example, a hybrid connecting layer in the hybrid connecting composite layer close to the first electrode is a second carrier type hybrid connecting layer, and a hybrid connecting layer in the hybrid connecting composite layer close to the second electrode is a first carrier type hybrid connecting layer.

For example, the hybrid connecting composite layer has a layer structure which is formed by a vacuum thermal evaporation process.

For example, the light emitting material composite layer on a side of the hybrid connecting composite layer has a layer structure which is formed by a solution process, and the first light emitting layer has a layer structure which is formed by a vacuum thermal evaporation process.

For example, the first carrier is hole, the second carrier is electron, the first electrode is an anode, and the second electrode is a cathode. In this case, the first carrier transport layer is a hole transport layer, and the second carrier transport layer is an electron transport layer. The first carrier inject layer is a hole inject layer, and the second carrier transport layer is an electron inject layer. Moreover, the first carrier type hybrid connecting layer is hole type hybrid connecting layer, i.e., a p-type hybrid connecting layer; and the second carrier type hybrid connecting layer is an electron type hybrid connecting layer, i.e., a n-type hybrid connecting layer.

In a second aspect, embodiments of the present disclosure provide a display panel, comprising the hybrid light emitting device in the first aspect.

In a third aspect, embodiments of the present disclosure provide a display device, comprising the display panel in the second aspect.

The display panel and the display device according to embodiments of the present disclosure have same or similar embodiments with the hybrid light emitting device as described above, and have same or similar technical effects, which are not repeated herein for simplicity.

BRIEF DESCRIPTION OF THE DRAWINGS

In order to explain the technical solutions in the embodiments of the present disclosure or the prior art more clearly, the drawings to be used in the description of the embodiments or the prior art will be introduced briefly in the following. Apparently, the drawings described below are only some embodiments of the present disclosure.

DETAILED DESCRIPTION OF EMBODIMENTS

Figure 1:
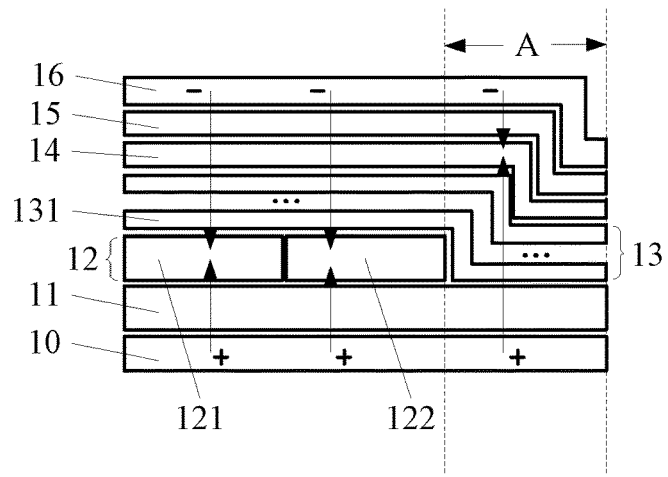
FIG. 1 is a structural view for a hybrid light emitting device in an embodiment of the present disclosure.

Embodiment of the hybrid light emitting device, the display panel, and the display device will be described hereinafter with reference to the accompanying drawings.

Reference numeral: 10 anode, 11 hole transport layer, 12 light emitting material composite layer, 13 hybrid connecting composite layer, 14 first light emitting layer, 15 electron transport layer, 16 cathode, 17 hole inject layer, 18 electron inject layer, 131 hybrid connecting layer, 121 second light emitting layer, 122 third light emitting layer.

In order to prevent the property of interface between light emitting layers which are formed by two processes in the hybrid light emitting device is adversely affected, generally a hybrid connecting layer (HCL) is arranged between these two light emitting layers to improve performance of the hybrid light emitting device. The HCL transports holes for the light emitting layer which is formed by the solution process, and electrons for the light emitting layer which is formed by the evaporation process. The inventors found this makes it difficult to balance different carriers transported by the light emitting layers formed by two processes, so that the light emitting layers in different layers emit light simultaneously in the overlapping portion. As a result, sub-pixel units in the display device which correspond to the hybrid light emitting device cannot emit light of a desired color, and the display effect of display device degrades.

Embodiments of the present disclosure provides a hybrid light emitting device, comprising a first electrode, a light emitting material composite layer, a hybrid connecting composite layer, a first light emitting layer, and a second electrode which are stacked in this order. A projection of the first light emitting layer on the first electrode at least partially does not overlap with a projection of the light emitting material composite layer on the first electrode. The first electrode and the second electrode are configured to provide a first carrier and a second carrier during operation, respectively. For example, one of the first electrode and the second electrode is an anode, and the other is a cathode. Namely, when the second electrode is an anode, the first electrode is a cathode, while when the second electrode is a cathode, the first electrode is an anode. The first carrier transport layer close to the first electrode is a hole transport layer, and the second carrier transport layer close to the second electrode is an electron transport layer.

In the hybrid light emitting device of this embodiment, the hybrid connecting composite layer comprises at least two hybrid connecting layers, and the first carrier mobility increases and the second carrier mobility decreases in the at least two hybrid connecting layers, in a direction from the first electrode to the second electrode. To this end, the first carrier from the first electrode is efficiently transported to the first light emitting layer close to the second electrode, and the second carrier from the second electrode is efficiently transported to the light emitting material composite layer close to the first electrode. It is ensured that the first light emitting layer and the light emitting material composite layer do not emit light simultaneously in the overlapping portion, so that the sub-pixel unit emits light of a desired color, and the display effect of display device is improved.

The hybrid light emitting device in embodiments of the present disclosure will be described with reference to a case in which the first electrode is an anode, the second electrode is a cathode, the first carrier transport layer is a hole transport layer, and the second carrier transport layer is an electron transport layer.

As shown in FIG. 1, in an embodiment of the present disclosure, a hybrid light emitting device comprises an anode 10, a hole transport layer (HTL) 11, a light emitting material composite layer 12, a hybrid connecting composite layer 13, a first light emitting layer 14, an electron transport layer (ETL) 15, and a cathode 16 which are stacked in this order. The light emitting material composite layer 12 comprises a second light emitting layer 121 and a third light emitting layer 122 which are arranged in a same layer. A projection of the first light emitting layer 14 on the anode 10 at least partially does not overlap with a projection of the light emitting material composite layer 12 on the anode 10. The hybrid connecting composite layer 13 comprises at least two hybrid connecting layers 131 which are stacked. The hybrid connecting layer 131 in the hybrid connecting composite layer 13 close to the cathode 16 is a p-type hybrid connecting layer. The p-type hybrid connecting layer is made from a p-type host material, and the p-type host material has a hole mobility larger than an electron mobility. The hybrid connecting layer 131 close to the anode 10 in the hybrid connecting composite layer 13 is a n-type hybrid connecting layer. The n-type hybrid connecting layer is made from a n-type host material, and the n-type host material has an electron mobility larger than a hole mobility. A material for forming the hybrid connecting layer 131 for example is biphenyldiamine derivatives, crosslinked Biphenyl diamine derivatives, shaped non-crystalline derivatives, carbazole derivatives, phosphine oxide containing derivatives, or (tetra(aryl) silane containing derivatives.

It is noted that in embodiments of the present disclosure, the projection on the first electrode refers to a projection on a plane in which a surface of the first electrode lies.

It is noted that in the above embodiments, the hybrid light emitting device comprises the anode 10, the hole transport layer 11, the light emitting material composite layer 12, the hybrid connecting composite layer 13, the first light emitting layer 14, the electron transport layer 15 and the cathode 16 which are stacked in this order. In this structure, the hole transport layer and the electron transport layer are optional. Moreover, the hybrid light emitting device is not limited to the structure in the above embodiments. For example, in another structure, the hybrid light emitting device comprises a cathode, an electron transport layer, a light emitting material composite layer, a hybrid connecting composite layer, a first light emitting layer, a hole transport layer and an anode which are stacked in this order. A hybrid light emitting device with modification or simple replacement in structure with respect to the above hybrid light emitting device falls within the scope of the present disclosure.

The inventor conducted experiments on a hybrid light emitting device which is designed to emit blue light. In these experiments, the hybrid connecting layer HCL is a single layer. The experimental data is shown in Table 1. As shown, when the HCL is absent, the hybrid light emitting device has a high operating voltage and low luminous efficiency and quantum efficiency. With an increase in the thickness of HCL, the hybrid light emitting device which is provided with HCL improves in both luminous efficiency and quantum efficiency. However, these hybrid light emitting devices still emit light simultaneously in the overlapping region of the plurality of light emitting layers, and the sub-pixel units do not emit light of a desired color.

TABLE 1

| structure | voltage (V) | luminous efficiency (Cd/A) | quantum efficiency | chromaticity coordinate x | chromaticity coordinate y |
|---|---|---|---|---|---|
| without HCL | 3.6 | 4.7 | 4.9 | 0.143 | 0.107 |
| HCL 1 nm | 3.42 | 5.3 | 6.3 | 0.145 | 0.088 |
| HCL 5 nm | 3.46 | 5.9 | 6.9 | 0.144 | 0.089 |

Figure 2:
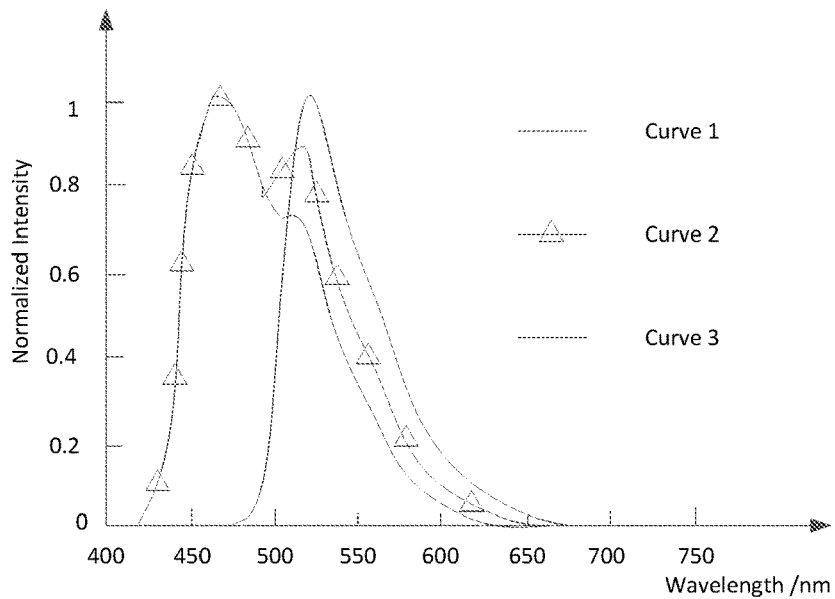
FIG. 2 is a spectrum of a hybrid light emitting device.

The inventor further conducted experiments on a hybrid light emitting device which is designed to emit green light. In these experiments, the hybrid connecting layer HCL is a single layer. The experimental data are shown in FIG. 2, which shows emission spectrum of the hybrid light emitting device. As shown in FIG. 2, curve 1 is a spectrum of light emitted by a hybrid light emitting device which is provided with a hybrid connecting layer with a thickness of 5 nm, curve 2 is a spectrum of light emitted by a hybrid light emitting device without a hybrid connecting layer, and curve 3 is a spectrum of light emitted by a hybrid light emitting device which is provided with a hybrid connecting layer with a thickness of 1 nm. When the hybrid connecting layer is absent (curve 2), the hybrid light emitting device not only presents a green light peak in a wavelength range of 500-560 nm, but also a blue light peak in a wavelength range of 450-480 nm, and this is not desired. When a hybrid connecting layer with a thickness of 5 nm is provided (curve 1), the blue light peak has a relative intensity which is remarkable than curve 2. As can be seen, the hybrid light emitting device does not emit the desired blue light, when a relatively thick hybrid connecting layer is provided or absent. The inventor has found from these experimental results that, a single layer HCL can not meet the requirements of the hybrid light emitting device, and thus proposes a multiple HCL solution.

In the hybrid light emitting device according to embodiments of the present disclosure, at least two (i.e., two or more) hybrid connecting layers 131 are arranged between the light emitting material composite layer 12 which is formed by a solution process and the first light emitting layer 14 which is formed by an evaporation process. A hybrid connecting layer of these at least two hybrid connecting layers 131 close to the cathode 16 is a p-type hybrid connecting layer, and a hybrid connecting layer close to the anode 10 is a n-type hybrid connecting layer. As compared with the hybrid light emitting device in which a single HCL is arranged between the layers formed by two processes, in the hybrid light emitting device according to embodiments of the present disclosure, the hybrid connecting layer 131 close to the electron transport layer 15 is capable of successfully transporting electrons to the corresponding light emitting layer, and the hybrid connecting layer 131 close to the hole transport layer 11 is capable of successfully transporting holes to the corresponding light emitting layer. In this way, it is ensured that the plurality of light emitting layers do not emit light simultaneously in the overlapping region, the sub-pixel units emit light of a desired color, and the display effect of display device is improved.

Further, the hybrid connecting composite layer 13 has a total thickness of about 1 nm~10 nm. Namely, the sum of thickness the hybrid connecting layers 131 is larger than or equal to 1 nm, and smaller than or equal to 10 nm. It is noted that if the hybrid connecting composite layer 13 has a thickness smaller than 1 nm, electrons supplied by the cathode 16 and holes supplied by the anode 10 may pass through each hybrid connecting layer 131 in the hybrid connecting composite layer 13, so that the first light emitting layer 14 in the overlapping portion between a projection of the light emitting material composite layer 12 on the anode 10 and a projection of the first light emitting layer 14 on the anode 10 emits light, and sub-pixel units in the display device which correspond to the second light emitting layer 121 and the third light emitting layer 122 do no emit light of a desired color, so that the display effect of display device degrades. If the hybrid connecting composite layer 13 has a thickness larger than 10 nm, electrons supplied by the cathode 16 and holes supplied by the anode 10 may hardly pass through the hybrid connecting composite layer 13, and may hardly stay in each light emitting layer (the first, second and third light emitting layer 14, 121, 122). This causes that the light emitting layers does not emit light uniformly or some of the layers do not emit light. In embodiments of the present disclosure, the hybrid connecting composite layer 13 comprises the hybrid connecting layers 131 with a total thickness of about 1 nm~10 nm, and it is ensured that electrons supplied by the cathode 16 are transported to each light emitting layer through the hybrid connecting layer 131 which is formed by p-type host material, and that holes supplied by the anode 10 are transported to each light emitting layer through the hybrid connecting layer 131 which is formed by a n-type host material. In this way, each light emitting layer normally emits light in the non-overlapping region, sub-pixel units to which each light emitting layer corresponds emits light of a desired color, and the display effect of display device is improved.

It is noted that, the anode 10, the hole transport layer 11 and the light emitting material composite layer 12 in the hybrid light emitting device are formed by a solution process, while the hybrid connecting composite layer 13, the first light emitting layer 14, the electron transport layer 15 and the cathode 16 are formed by a vacuum thermal evaporation process. In other embodiments, the light emitting material composite layer and the first light emitting layer are interchanged in position, the light emitting material composite layer is formed by a vacuum thermal evaporation process, and the first light emitting layer is formed by a solution process.

Figure 3:
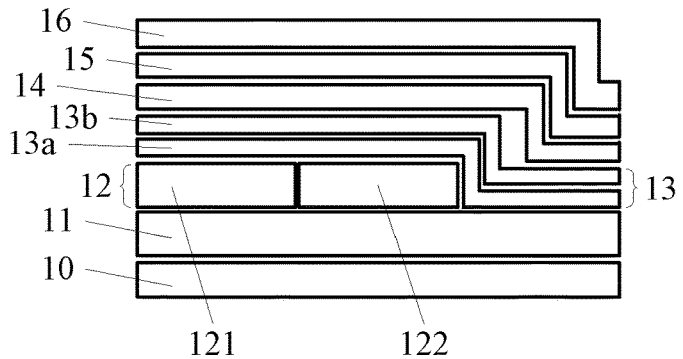
FIG. 3 is a structural view for a hybrid light emitting device in an embodiment of the present disclosure.

When the hybrid connecting composite layer 13 comprises two hybrid connecting layers 131, as shown in FIG. 3, a hybrid connecting layer 13a is a n-type hybrid connecting layer, and a hybrid connecting layer 13b is a p-type hybrid connecting layer. Each of the hybrid connecting layer 13a and the hybrid connecting layer 13b has a thickness smaller than 3 nm. If each hybrid connecting layer has a too large thickness, electrons supplied by the cathode 16 and holes supplied by the anode 10 may hardly pass through the hybrid connecting composite layer 13. By setting the thickness of each hybrid connecting layer smaller than 3 nm, the efficiency for the hybrid connecting layer to transport electrons and holes improves, and the luminous efficiency of the hybrid light emitting device thus improves.

Figure 4:
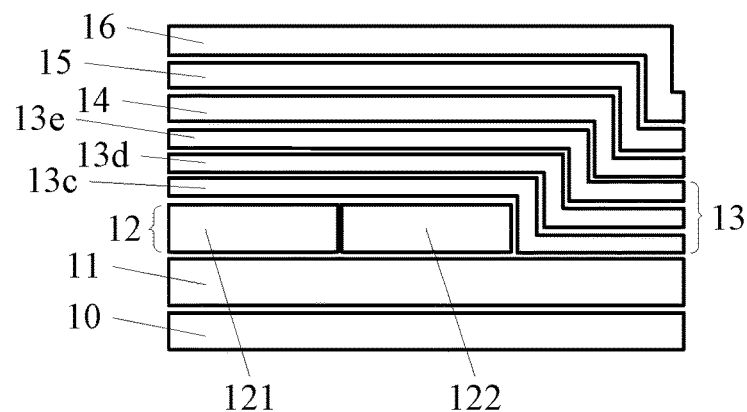
FIG. 4 is a structural view for a hybrid light emitting device in an embodiment of the present disclosure.

When the hybrid connecting composite layer 13 comprises at least two hybrid connecting layers 131, the hybrid connecting layers 131 which are arranged in a direction from the anode to the cathode gradually increase in term of hole mobility and gradually decrease in term of electron mobility. For example, as shown in FIG. 4, the hybrid connecting composite layer 13 comprises three hybrid connecting layers 13c, 13d, 13e, in which the hybrid connecting layer 13c is a n-type hybrid connecting layer, and the hybrid connecting layer 13e is a p-type hybrid connecting layer. The hybrid connecting layer 13d is arranged between the hybrid connecting layer 13c and the hybrid connecting layer 13e. The hybrid connecting layer 13d has an electron mobility smaller than that of the hybrid connecting layer 13c and larger than that of the hybrid connecting layer 13e. The hybrid connecting layer 13d has a hole mobility larger than that of the hybrid connecting layer 13c and smaller than that of the hybrid connecting layer 13e.

It is noted that in the above embodiments, each layer in the hybrid connecting layer 131 has a triplet energy level larger than 2.1 eV. Since the hybrid connecting layer is adjacent with the light emitting layer (e.g., the first light emitting layer 14, the second light emitting layer 121 and the third light emitting layer 122 in this embodiment), these light emitting layers for example is a phosphorescence emitting layer or other light emitting layer. Each layer in the hybrid connecting layer 131 has a triplet energy level larger than 2.1 eV, and this facilitates improving luminous efficiency of each light emitting layer in the hybrid light emitting device.

Figure 5:
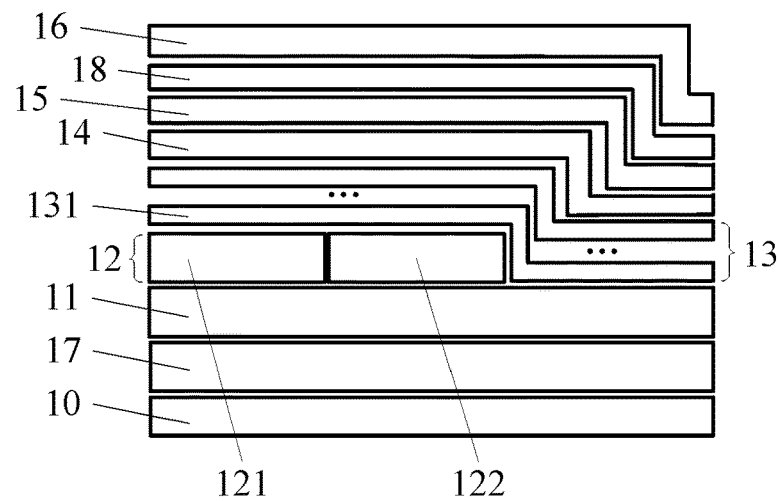
FIG. 5 is a structural view for a hybrid light emitting device in an embodiment of the present disclosure.

As shown in FIG. 5, on the basis of the above embodiments, a hole inject layer (HIL) 17 for example is arranged between the anode 10 and the hole transport layer 11, and/or an electron inject layer (EIL) 18 is arranged between the cathode 16 and the electron transport layer 15. Holes supplied by the anode 10 are further injects into the hole transport layer 11 by the hole inject layer 17, and transported through the hole transport layer 11 to each light emitting layer. Electrons supplied by the cathode 16 are further injected into the electron transport layer 15 by the electron inject layer 18, and transported through the electron transport layer 15 to each light emitting layer. It is noted that the hole inject layer 17 is formed by a same process as the anode 10, the hole transport layer 11 and the light emitting material composite layer 12, for example by the solution process, while the electron inject layer 18 is formed by a same process as the hybrid connecting composite layer 13, the first light emitting layer 14, the electron transport layer 15 and the cathode 16, for example by the evaporation process.

The structure of the first light emitting layer 14, the second light emitting layer 121 and the third light emitting layer 122 will be described hereinafter.

First, the light emitting layer (the first light emitting layer 14, the second light emitting layer 121 and the third light emitting layer 122) comprises a layer which is a light emitting layer for emitting red light, a layer which is a light emitting layer for emitting green light, and a layer which is a light emitting layer for emitting blue light. Namely, the first light emitting layer 14, the second light emitting layer 121 and the third light emitting layer 122 are capable of emitting light of different colors. The present disclosure is not limited in term of the corresponding relationship between the first, second and third light emitting layer 14, 121, 122 and the light emitting layers for emitting red, green and blue light. For example, in an embodiment, the first light emitting layer 14 is a light emitting layer for emitting red light, the second light emitting layer 121 is a light emitting layer for emitting green light, and the third light emitting layer 122 is a light emitting layer for emitting blue light. For example, in another embodiment, the first light emitting layer 14 is a light emitting layer for emitting blue light, the second light emitting layer 121 is a light emitting layer for emitting red light, and the third light emitting layer 122 is a light emitting layer for emitting green light. For example, in another embodiment, the first light emitting layer 14 is a light emitting layer for emitting blue light, the second light emitting layer 121 is a light emitting layer for emitting green light, and the third light emitting layer 122 is a light emitting layer for emitting red light. The corresponding relationship between the first, second and third light emitting layer 14, 121, 122 and the light emitting layers for emitting red, green and blue light comprises, but is not limited to these combinations.

In practice, as compared with the light emitting layers for emitting red and green light, there is a room for improving performance of the light emitting layer for emitting blue light. Thus, in an example, the first light emitting layer 14 is a light emitting layer for emitting blue light, and is formed by the mature vacuum thermal evaporation process to improve the quality of film/layer, and to improve performance of emitting light. It is noted that, the film-forming process for the first light emitting layer 14 is not limited to the vacuum thermal evaporation. In principle, the first light emitting layer 14 can be formed by spin coating, spraying, ink jetting, or any film-forming process known in the art.

To ensure each light emitting layer corresponds with a sub-pixel unit, and the sub-pixel unit is capable of emitting a light of color corresponding with each light emitting layer, a projection of the first light emitting layer 14 on the anode 10 at least partially does not overlap with a projection of the light emitting material composite layer 12 on the anode 10. In particular, the first light emitting layer 14, which corresponds to the projection of the first light emitting layer 14 on the anode 10 (this projection does not overlap with the projection of the light emitting material composite layer 12 on the anode 10) emits light, the light can be transported to the corresponding sub-pixel unit, and holes supplied by the anode can also be transported to the first light emitting layer 14.

For example, as shown in FIG. 1, "−" indicates electrons supplied by the cathode 16, and "+" indicates holes supplied by the anode 10. Holes supplied by the anode 10 are transported to the second light emitting layer 121 and the third light emitting layer 122 through the hole transport layer 11. Electrons supplied by the cathode 16 are transported to the second light emitting layer 121 and the third light emitting layer 122 through the electron transport layer 15, the first light emitting layer 14 and the hybrid connecting composite layer 13. In this way, both the second light emitting layer 121 and the third light emitting layer 122 emit light normally. A portion of the hybrid connecting composite layer 13 is arranged above the light emitting material composite layer 12, and another portion is arranged above the hole transport layer 11. The portion of hybrid connecting layer above the hole transport layer 11 is located at the right side of the third light emitting layer 122. Holes supplied by the anode 10 are transported to the portion of the first light emitting layer 14 to which region A corresponds, through the hole transport layer 11 and the hybrid connecting composite layer 13. Electrons supplied by the cathode 16 are transported to the portion of the first light emitting layer 14 to which region A corresponds, through the electron transport layer. The portion of the first light emitting layer 14 to which region A corresponds emits light normally. The light emitted by the portion of the first light emitting layer 14 to which region A corresponds can be transported to the corresponding sub-pixel unit, and is not blocked by a light emitting layer for emitting light of another color.

Figure 6:
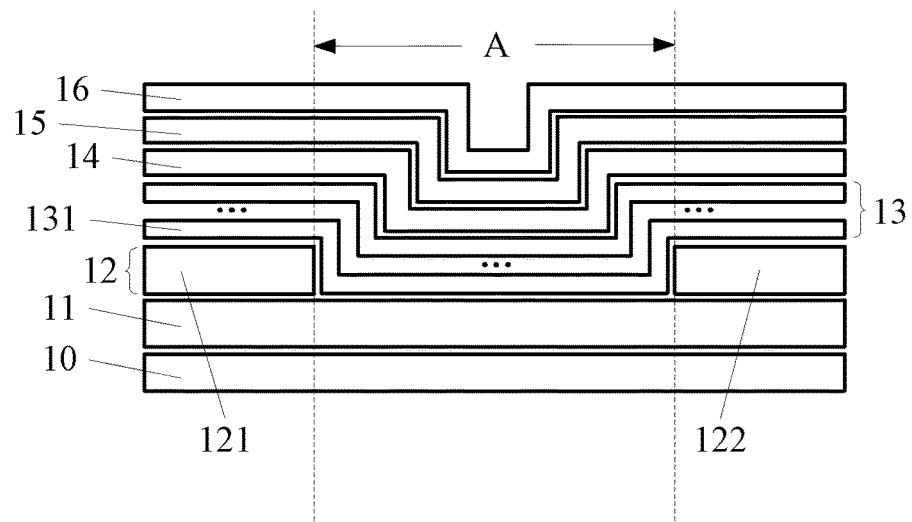
FIG. 6 is a structural view for a hybrid light emitting device in an embodiment of the present disclosure.

In an alternative embodiment, as shown in FIG. 6, a portion of the hybrid connecting composite layer 13 is arranged above the light emitting material composite layer 12, and another portion is arranged above the hole transport layer 11. The hybrid connecting composite layer 13 arranged above the hole transport layer 11 is arranged between the second light emitting layer 121 and the third light emitting layer 122. The light emitted by the portion of the first light emitting layer 14 to which region A corresponds can be transported to the corresponding sub-pixel unit, and is not blocked by a light emitting layer for emitting light of another color.

The hybrid connecting composite layer 13, the first light emitting layer 14, the electron transport layer 15 and the cathode 16 can be arranged as shown in FIGS. 1-6, but are not limited to these.

Embodiments of the present disclosure further provide a display panel, comprising the hybrid light emitting device in the above embodiments. The display panel for example is an organic light emitting diode (OLED) panel, and the hybrid light emitting device in the display panel has the same advantages as the hybrid light emitting device in the above embodiments.

Embodiments of the present disclosure further provide a display device, comprising the display panel in the above embodiments. In particular, the display device for example is any product or component with a display function like a mobile phone, tablet computer, TV, monitor, notebook computer, digital photo frame, navigator, electronic paper, or the like. The display panel in the display device comprises the same advantages as the display panel in the above embodiments, which are not repeated here.

In the hybrid light emitting device, the display panel and the display device according to embodiments of the present disclosure, at least two hybrid connecting layers are arranged between the light emitting material composite layer which is formed by a solution process and the first light emitting layer which is formed by an evaporation process. A hybrid connecting layer of these at least two hybrid connecting layers close to the cathode is a p-type hybrid connecting layer, and a hybrid connecting layer close to the anode is a n-type hybrid connecting layer. As compared with the hybrid light emitting device in which a single HCL is arranged between the layers formed by two processes, in the hybrid light emitting device according to embodiments of the present disclosure, the hybrid connecting layer close to the electron transport layer is capable of successfully transporting electrons to the corresponding light emitting layer, and the hybrid connecting layer close to the hole transport layer is capable of successfully transporting holes to the corresponding light emitting layer. In this way, it is ensured that the plurality of light emitting layers do not emit light simultaneously in the overlapping region, the sub-pixel units emit light of a desired color, and the display effect of display device is improved.

In the above embodiments, the light emitting material composite layer and the first light emitting layer at two sides of the HCL are formed by different processes. However, it is noted that the concept of the above embodiments is also applicable to a case in which the light emitting material composite layer and the first light emitting layer at two sides of the HCL are formed by a same process. As a result, the first carrier from the first electrode is efficiently transported to the first light emitting layer close to the second electrode, and the second carrier from the second electrode is efficiently transported to the light emitting material composite layer close to the first electrode.

Unless otherwise defined, the technical or scientific terms used in the present invention shall have the general meanings understandable for those ordinarily skilled in the field of the present disclosure. The wordings such as "first", "second" or similar used in the description and claims of the present invention shall not represent any order, number or importance, but are used for distinguishing different elements.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A hybrid light emitting device, comprising a first electrode, a light emitting material composite layer, a hybrid connecting composite layer, a first light emitting layer, and a second electrode which are stacked in this order,
   wherein a projection of the first light emitting layer on the first electrode at least partially does not overlap with a projection of the light emitting material composite layer on the first electrode;
   wherein the first electrode and the second electrode are configured to provide a first carrier and a second carrier during operation, respectively; and
   wherein the hybrid connecting composite layer comprises at least two hybrid connecting layers, and in a direction from the first electrode to the second electrode, the at least two hybrid connecting layers increase in term of the first carrier mobility and decrease in term of the second carrier mobility.

2. The hybrid light emitting device of claim 1, wherein the hybrid connecting composite layer has a total thickness of about 1 nm~10 nm.

3. The hybrid light emitting device of claim 1, wherein the hybrid connecting composite layer comprises three hybrid connecting layers.

4. The hybrid light emitting device of claim 1, wherein each of the hybrid connecting layers has a thickness smaller than 3 nm.

5. The hybrid light emitting device of claim 1, wherein each of the at least two hybrid connecting layers has a triplet energy level larger than 2.1 eV.

6. The hybrid light emitting device of claim 1, further comprising a first carrier transport layer which is arranged between the first electrode and the light emitting material composite layer.

7. The hybrid light emitting device of claim 6, further comprising a first carrier inject layer which is arranged between the first electrode and the first carrier transport layer.

8. The hybrid light emitting device of claim 1, further comprising a second carrier transport layer which is arranged between the first light emitting layer and the second electrode.

9. The hybrid light emitting device of claim 1, further comprising a second carrier inject layer which is arranged between the second carrier transport layer and the second electrode.

10. The hybrid light emitting device of claim 1, wherein the light emitting material composite layer comprises a second light emitting layer and a third light emitting layer which are arranged in a same layer.

11. The hybrid light emitting device of claim 10, wherein the first light emitting layer is a light emitting layer for emitting blue light, the second light emitting layer is a light emitting layer for emitting green light, and the third light emitting layer is a light emitting layer for emitting red light.

12. The hybrid light emitting device of claim 1, wherein a hybrid connecting layer in the hybrid connecting composite layer close to the first electrode is a second carrier type hybrid connecting layer, and a hybrid connecting layer in the hybrid connecting composite layer close to the second electrode is a first carrier type hybrid connecting layer.

13. The hybrid light emitting device of claim 1, wherein the hybrid connecting composite layer has a layer structure which is formed by a vacuum thermal evaporation process.

14. The hybrid light emitting device of claim 1, wherein the light emitting material composite layer on a side of the hybrid connecting composite layer has a layer structure which is formed by a solution process, and the first light emitting layer has a layer structure which is formed by a vacuum thermal evaporation process.

15. The hybrid light emitting device of claim 1, wherein the first carrier is hole, the second carrier is electron, the first electrode is an anode, and the second electrode is a cathode.

16. A display panel, comprising the hybrid light emitting device of claim 1.

17. A display device, comprising the display panel of claim 16.

18. The hybrid light emitting device of claim 2, wherein the first carrier is hole, the second carrier is electron, the first electrode is an anode, and the second electrode is a cathode.

19. The hybrid light emitting device of claim 3, wherein the first carrier is hole, the second carrier is electron, the first electrode is an anode, and the second electrode is a cathode.

20. The hybrid light emitting device of claim 4, wherein the first carrier is hole, the second carrier is electron, the first electrode is an anode, and the second electrode is a cathode.

* * * * *